(12) United States Patent
Godfrey et al.

(10) Patent No.: US 11,906,334 B2
(45) Date of Patent: Feb. 20, 2024

(54) FIBRE OPTIC CABLES

(71) Applicant: OptaSense Holdings Limited, Farnborough (GB)

(72) Inventors: Alastair Godfrey, Farnborough (GB); Robert Ellwood, Farnborough (GB)

(73) Assignee: Optasense Holdings Limited, Camberley (GB)

( * ) Notice: Subject to any disclaimer, the term of this patent is extended or adjusted under 35 U.S.C. 154(b) by 346 days.

(21) Appl. No.: 17/275,490

(22) PCT Filed: Sep. 6, 2019

(86) PCT No.: PCT/GB2019/052497
§ 371 (c)(1),
(2) Date: Mar. 11, 2021

(87) PCT Pub. No.: WO2020/053558
PCT Pub. Date: Mar. 19, 2020

(65) Prior Publication Data
US 2022/0034688 A1    Feb. 3, 2022

(30) Foreign Application Priority Data
Sep. 13, 2018  (GB) .................................... 1814891

(51) Int. Cl.
*G01D 5/353* (2006.01)
*G01K 11/3206* (2021.01)
(Continued)

(52) U.S. Cl.
CPC ..... *G01D 5/35377* (2013.01); *G01K 11/3206* (2013.01); *G01L 1/243* (2013.01); *G01L 11/025* (2013.01); *G01R 33/0327* (2013.01)

(58) Field of Classification Search
CPC .... G01D 5/353; G01D 5/268; G01D 5/35303; G01H 9/004; G01H 11/08
See application file for complete search history.

(56) References Cited

U.S. PATENT DOCUMENTS

| | | | |
|---|---|---|---|
| 4,846,547 A * | 7/1989 | Falco | ........................ G01K 5/72 385/28 |
| 2007/0156019 A1 | 7/2007 | Larkin et al. | |
| 2018/0153381 A1 | 6/2018 | Wei et al. | |

FOREIGN PATENT DOCUMENTS

| | | |
|---|---|---|
| CN | 102162886 | 8/2011 |
| CN | 102162886 A | 8/2011 |

(Continued)

OTHER PUBLICATIONS

International Searching Authority, International Search Report and Written Opinion dated Nov. 27, 2019, issued in connection with International Patent Application No. PCT/GB2019/052497, filed on Sep. 6, 2019, 14 pages.

(Continued)

*Primary Examiner* — Tony Ko
(74) *Attorney, Agent, or Firm* — McDonnell Boehnen Hulbert & Berghoff LLP

(57) ABSTRACT

A fibre optic cable structure (300) suitable for fibre optic sensing with an improved sensitivity to an environmental parameter is described. The structure (300) includes an optical fibre (301) and a bend inducer (304) responsive to the environmental parameter to control bending of the optical fibre. The bend inducer (304) is configured to adopt a first configuration, that induces a first curvature of the optical fibre, at a first value of the environmental parameter and to adopt a second configuration at a second, different, value of the environmental parameter that induces a second, different, curvature of the optical fibre. By action of the bend inducer (304) a change in value of the environmental parameter imparts a bending force on the optical fibre.

15 Claims, 5 Drawing Sheets

(51) Int. Cl.
    *G01L 1/24*      (2006.01)
    *G01L 11/02*     (2006.01)
    *G01R 33/032*    (2006.01)

(56)             References Cited

FOREIGN PATENT DOCUMENTS

| | | |
|---|---|---|
| CN | 105606276 | 5/2016 |
| CN | 105606276 B | 6/2018 |
| EP | 1759931 | 3/2007 |
| EP | 1759931 A1 | 3/2007 |
| GB | 2442745 A | 4/2008 |
| WO | 2012/095640 | 7/2012 |
| WO | 2012095640 A2 | 7/2012 |
| WO | 2012137021 A2 | 10/2012 |
| WO | 2012137022 A2 | 10/2012 |
| WO | 2020053558 A1 | 3/2020 |

OTHER PUBLICATIONS

International Search Report and Written Opinion dated Nov. 27, 2019 for International Application No. PCT/GB2019/052497, 14 pages.
United Kingdom Search Report dated Mar. 13, 2019 for Great Britain Application No. GB1814891.6, 3 pages.

* cited by examiner

FIBRE OPTIC CABLES

This application is a U.S. national phase application of International Patent Application no. PCT/GB2019/052497 filed Sep. 6, 2019, which claims the benefit of Great Britain Application no. 1814891.6, filed Sep. 13, 2018.

This application relates to fibre optic cables and methods of manufacture thereof that are suitable for use for fibre optic sensing, especially for fibre optic sensing and in particular to a fibre optic cable structure that provides good sensitivity characteristics.

Various types of fibre optic sensing are known type, where an optical fibre is deployed as a sensing fibre and interrogated with electromagnetic radiation to provide sensing of environmental stimuli along its length, e.g. pressure waves acting on the sensing fibre causing dynamic strain.

One type of fibre optic sensing is distributed fibre optic sensing, which interrogates the sensing fibre with optical radiation and analyses the backscatter from inherent scattering sites within the sensing optical fibre. By analysing this backscattered from within the fibre, the fibre can effectively be divided into a plurality of discrete sensing portions which may be (but do not have to be) contiguous. Within each discrete sensing portion disturbances of the fibre, for instance, dynamic strains due to incident acoustic waves, cause a variation in the properties of the radiation which is backscattered from that portion. This variation can be detected and analysed and used to give a measure of the intensity of disturbance of the fibre at that sensing portion. Thus the distributed fibre optic sensor effectively acts as a linear sensing array of sensing portions of the optical fibre. Distributed acoustic sensing (DAS) is one particular form of distributed fibre optic sensing used to sense mechanical disturbances or dynamic strains acting on the sensing fibre.

In a distributed fibre optic sensor, the radiation of interest which is detected and analysed is that which is backscattered from inherent scattering sites within the fibre. The sensing function is thus distributed throughout the whole fibre and the spatial resolution and arrangement of the various sensing portions depends on the characteristics of the interrogating radiation and the processing applied.

Various types of DAS sensor have been demonstrated including sensors based on Rayleigh scattering of coherent light from the sensing fibre. Light transmitted into an optical fibre will be Rayleigh scattered from various inherent, i.e. intrinsic, scattering sites within an optical fibre. A mechanical vibration or dynamic strain acting on the fibre, such as caused by an incident acoustic wave, will effectively alter the distribution of scattering sites resulting in a detectable change in the properties of the Rayleigh backscattered light. Analysing such changes allows vibrations/acoustic stimuli acting on sensing portions of the optical fibre to be detected.

Such DAS sensors therefore typically perform repeated interrogations of the sensing fibre where each interrogation involves transmitting at least one pulse of coherent optical radiation into the optical fibre and detecting the intensity of backscattered light from each of a number of sensing portions of the sensing fibre, also called channels, of the DAS sensor. In one type of DAS sensor the intensity of Rayleigh backscatter from a given channel in response to separate interrogations of the sensing fibre is monitored to determine any acoustic stimulus acting on the fibre and in one example each interrogation involves launching a single continuous pulse of coherent interrogating radiation. As mentioned above the backscatter from the fibre will depend on the distribution of the inherent scattering sites within the fibre, which will vary effectively randomly along the length of the fibre. Thus the backscatter intensity from any given interrogating pulse will exhibit a random variation from one sensing portion to the next but, in the absence of any environmental stimulus, the backscatter intensity from any given sensing portion should remain the same for each repeated interrogation (provided the characteristics of the interrogating pulse remains the same). However an environmental stimulus acting on the relevant sensing portion of the fibre will result in an optical path length change for that section of fibre, e.g. through stretching/compression of the relevant section of fibre and/or a refractive index modulation. As the backscatter from the various scattering sites within the sensing portion of fibre will interfere to produce the resulting intensity, a change in optical path length will vary the degree of interference and thus result in a change in backscatter intensity. This change in intensity can be detected and used as an indication of a disturbance acting on the fibre, such as an incident acoustic wave.

As such DAS sensors respond to changes in effective optical path length of the sensing fibre, the sensing fibre will generally be most sensitive to stimuli inducing longitudinal strains acting on the optical fibre. For part of a sensing fibre optic deployed in a medium along a generally straight path, that part of sensing fibre will thus generally be most sensitive to acoustic waves propagating in the medium in a direction longitudinally along the fibre. For such longitudinal waves the fibre length is directly affected by the pressure change as the medium compresses and expands as the wave propagates. For waves travelling perpendicularly to the optical fibre, the sensitivity is lower as the fibre will largely be moved from side to side within the medium. There will be some longitudinal strain due to the displacement of the fibre and also from the diameter change of the fibre as the pressure wave passes but the effect will be much lower than for an equivalent wave travelling longitudinally.

Other types of fibre optic based sensors rely on deliberately introduced features within the fibre, e.g. fibre Bragg gratings (FBGs) or the like, to induce reflection from a specific location in the fibre. Longitudinal strain on the fibre in the area of the grating will vary the properties of the grating, e.g. the spacing of the grating, and vary the properties of light reflected/transmitted from the grating. This may, for example vary the wavelength of light reflected/transmitted from the grating. The variation in wavelength can be detected and used to indicate the strain acting on the relevant part of the fibre. Multiple gratings can be arranged throughout the fibre at different locations to provide a plurality of point sensors along the length of the fibre. Such fibre optic sensors with FBGs also respond preferentially to longitudinal strain and thus likewise for waves travelling perpendicularly to the optical fibre the sensitivity is lower as the fibre will largely be moved from side to side within the surrounding medium.

In some applications a sensing fibre may be arranged in a path such that at least part of the sensing fibre is arranged to run longitudinally along an expected direction of propagation for signals of interest. However this may not be practical or convenient in some instances. For instance fibre optic sensing has been proposed for monitoring subterranean formations, e.g. for seismic surveying and a sensing fibre may be deployed in a borehole drilled into or near the formation. It may generally be most convenient to drill a generally vertical borehole and the signals of interest in this case may be those propagating transversely to the borehole.

There is therefore a desire to provide fibre optic cables with an improved sensitivity to transverse stimuli.

The principles of Rayleigh based distributed fibre optic sensing have also been applied for other sensing applications. For instance it has been proposed to use a magnetically sensitised optical fibre to provide a distributed fibre optic sensor for magnetic field variations. The magnetically sensitised optical fibre may be mechanically coupled to a magnetostrictive material whose dimensions vary according to the strength of the applied magnetic field. Variations in the magnetic field thus result in variations in the dimensions of the magnetostrictive material which translate to dynamic strains being applied to the optical fibre. Such dynamic strains can be detected using the principles of DAS and used to provide an indication of any variation in magnetic field along the length of the fibre. Likewise it has been proposed to use distributed fibre optic sensing based on Rayleigh backscatter to provide an indication of any temperature variations along the length of the fibre that result in a change of effective optical path length by temperature induced changes in dimension of the materials of the fibre optic cable. In such sensors a dimension change in material of the cable structure can impart some longitudinal strain on the sensing fibre, however the relatively high Young's modulus of the sensing fibre itself may limit the resulting change in optical path length.

There is therefore a desire to provide fibre optic cables with an improved sensitivity, especially to transverse stimuli.

Thus according to an embodiment of the present disclosure there is provided a fibre optic cable structure comprising: an optical fibre; and a bend inducer responsive to an environmental parameter to control bending of the optical fibre; wherein the bend inducer is configured to adopt a first configuration at a first value of said environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre.

As will be described in more detail below the bending force applied to the optical fibre by the bend inducer in response to a variation in the environmental parameter, e.g. pressure, will lead to a detectable signal when the optical fibre of such a fibre optic cable structure is used for fibre optic sensing. Such a cable structure can have an improved sensitivity to transverse pressure waves than conventional fibre optic cables and/or may respond well to other environmental parameters such as temperature or magnetic field.

In some examples the bend inducer may comprise: a first component with a longitudinal dimension that varies with the environmental parameter; and a second component with a longitudinal dimension that varies with the environmental parameter; wherein the amount of variation in said dimension of said first component to a given change in the environmental parameter is different to that of the second component. In some examples the first component and second component may be configured such that a given change in the environmental parameter results in a positive change in dimension for one of the first and second components and a negative change in dimension for the other of the first and second components. The first component of the bend inducer may be adjacent the second component of the bend inducer.

In some examples the first component may comprise a first material that has a first relationship between environmental parameter and changes in dimension and the second component may comprise a second material that has a second, different, relationship between environmental parameter and changes in dimension. The environmental parameter may be pressure and the first and second materials may exhibit a different Poisson ratio. The environmental parameter may be temperature and the first and second materials may exhibit a different thermal coefficient of expansion. The environmental parameter may be magnetic field strength and the first and second materials may exhibit a different magnetostrictive coefficient.

In some example at least one of the first and second components of the bend inducer may comprise a plurality elements adjacent one another in a longitudinal direction, where at least some of the plurality of elements are moveable with respect to one another in a transverse direction. The elements may be shaped such that relative transverse movement of an element with respect to its neighbouring elements changes the configuration of the elements and results in a change in a distance between the elements. The plurality of elements may comprise a plurality of first elements which are fixedly coupled to a first surface and a plurality of second elements which are moveable transversely with respect to the first surface. Each second element may be adjacent at least one first element. The plurality of second elements may be coupled to the first surface via resilient couplings and/or may be coupled to a second surface, on the opposite side of the second elements to the first surface.

In some examples the bend inducer may be configured such that a given change in the environmental parameter results in a positive change in a longitudinal dimension on a first side of the bend inducer components and a negative change in longitudinal dimension on a second opposite side of the bend inducer. The bend inducer, in some examples may comprise: a plurality of first elements fixedly coupled to a first surface at a first end and coupled to one another by resilient arms at a second opposite end. A plurality of second elements may be supported by the resilient arms such that transverse force applied to the resilient arms causes the second element to move transversely with respect to the first surface. Each second element may be located between two of the first elements. The first and second elements may be shaped such that relative transverse movement of a second element with respect to its neighbouring first elements results in a change in the distance between the first elements.

The bend inducer may be located on one side of a central longitudinal axis of the fibre optic cable structure and the optical fibre is located on an opposite side of the central longitudinal axis.

In some embodiments the bend induced may be arranged along a helical path within the fibre optic cable structure.

The fibre optic cable structure may comprise a plurality of bend inducers, at least some the bend inducers being configured to induce curvature of the optical fibre in different planes to one another.

The bend inducer may be configured to have a stiffness that substantially matches a stiffness of the fibre optic cable structure and/or a stiffness of the optical fibre.

Aspects also relate to a fibre optic sensing system comprising a fibre optic cable structure of any the variants described herein. The sensing system also includes an interrogator unit for interrogating the optical fibre of the fibre optic cable structure with electromagnetic radiation to provide fibre optic sensing. The sensing system may be a system for distributed acoustic sensing and the environmental parameter which the bend inducer respond to may be pressure.

Another aspect of the disclosure is the use a fibre optic cable structure of any the variants described herein for distributed fibre optic sensing.

In a further aspect, there is provided a fibre optic cable structure comprising: an optical fibre; and a force transformer configured to bend in response to a change in an environmental parameter; wherein the force transformer is configured to adopt a curvature that depends on a static value of the environmental parameter such that a change in the value of the environmental parameter results in a change in curvature of the force transformer that induces a curvature of the optical fibre to change.

In a further aspect, there is provided a fibre optic cable structure comprising: an optical fibre; and a bend inducer configured to induce shear forces within the fibre optic cable structure in response to a change in a defined environmental parameter to cause the fibre optic cable structure and the optical fibre to bend.

Unless expressly indicated otherwise, or clearly incompatible, any of the features of the fibre optic cable structures described herein may be implemented with any or more other features in any suitable combination.

The invention will now be described by way of example only with respect to the accompanying drawings, of which:

Embodiments of the present invention relate to fibre optic cables suitable for use for fibre optic sensing, e.g. distributed acoustic sensing (DAS), having an improved sensitivity to the detection of a physical parameter. Some embodiments relate to fibre optic cables suitable for use for fibre optic sensing, in particular for distributed fibre optic sensing, having relatively good sensitivity to dynamic transverse strains, for example improved transverse sensitivity compared to conventional fibre optic cables. Other embodiments relate to a fibre optic cable structure for use for distributed fibre optic sensing capable of detecting dynamic strains induced from temperature changes or changes in magnetic field.

Figure 1:
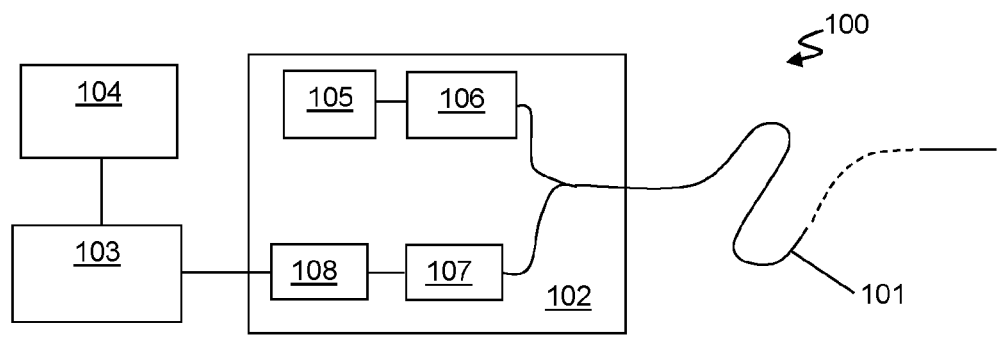
FIG. 1 illustrates a conventional DAS sensor apparatus.

FIG. 1 shows a schematic of a fibre optic sensing arrangement 100, which in this example is a distributed fibre optic sensing arrangement. A length of sensing optical fibre 101 is removably connected at one end to an interrogator 102. The output from interrogator 102 is, in some implementations, passed to a signal processor 103, which may be co-located with or integrated into the interrogator or may be remote therefrom. Optionally there may also be a user interface/graphical display 104, which may be may be co-located with the signal processor or may be remote therefrom and in practice may be realised by an appropriately specified PC.

The sensing fibre 101 can be many kilometres in length and can, in some applications be tens of kilometres in length, say up to 40 km or more. For distributed fibre optic sensing the sensing fibre may be a standard, unmodified single mode optic fibre such as is routinely used in telecommunications applications without the need for deliberately introduced reflection sites such a fibre Bragg grating or the like. The fibre will be protected by containing it with a cable structure which may contain more than one optical fibre.

In use the fibre optic cable comprising the sensing fibre 101 is deployed in an area of interest to be monitored. Depending on the particular use case the sensing fibre may be deployed in a relatively permanent manner, e.g. being buried or otherwise secured in place. If continuous monitoring is not required the interrogator 102 may be coupled to the sensing fibre when required and removed when sensing is not required.

In operation, the interrogator 102 launches coherent electromagnetic radiation into the sensing fibre, which will be referred to as interrogating radiation. The sensing fibre may, for instance, be repeatedly interrogated with pulses of optical radiation. In some embodiments a single pulse of optical radiation may be used for each interrogation, although in some embodiments multiple pulses may be used, in which case the optical pulses may have a frequency pattern as described in GB patent publication GB2,442,745 or optical characteristics such as described in WO2012/137022, the contents of which are hereby incorporated by reference thereto. Note that as used herein the term "optical" is not restricted to the visible spectrum and optical radiation includes infrared radiation and ultraviolet radiation. Any reference to "light" should also be construed accordingly.

As described in GB2,442,745 and WO2012/137022 the phenomenon of Rayleigh backscattering results in some fraction of the light input into the fibre being reflected back to the interrogator, where it is detected to provide an output signal which is representative of acoustic disturbances in the vicinity of the fibre. The interrogator therefore conveniently comprises at least one laser 105 and at least one optical modulator 106 for producing interrogating radiation, for example pairs of interrogating pulses separated by a known optical frequency difference. The interrogator also comprises at least one photodetector 107 arranged to detect radiation which is Rayleigh backscattered from the intrinsic scattering sites within the fibre 101. A Rayleigh backscatter DAS sensor is very useful but systems based on Brillouin or Raman scattering are also known.

The signal from the photodetector may be processed by processing module 108 of the interrogator 102 to provide a measurement signal which is representative of disturbances acting on the sensing portions or channels of the fibre. Some processing may additionally or alternatively be done by signal processor 103. The processing conveniently demodulates the returned signal based on the frequency difference between the optical pulses. The processing module may, in some implementations, process the detected backscatter for example as described in any of GB2,442,745, WO2012/137021 or WO2012/137022 and may also apply a phase unwrap algorithm. The phase of the backscattered light from various sections of the optical fibre can therefore be monitored. As described previously any changes in the effective optical path length within a given section of fibre, such as would be due to incident pressure waves causing strain on the fibre, can therefore be detected.

The form of the optical input and the method of detection allow a single continuous fibre to be spatially resolved into discrete longitudinal sensing portions. That is, the acoustic signal sensed at one sensing portion can be provided substantially independently of the sensed signal at an adjacent portion. Note that the term acoustic shall be taken to mean any type of pressure wave or mechanical disturbance or varying strain generated on the optical fibre and for the avoidance of doubt the term acoustic will be used in the specification to include seismic signals and waves or other types of vibration. As used in this specification the terms "distributed fibre optic sensing" and "distributed acoustic sensing" will be taken to mean sensing by optically interrogating an optical fibre to provide a plurality of discrete sensing portions distributed longitudinally along the fibre and the terms "distributed fibre optic sensor" and "distributed acoustic sensor" shall be interpreted accordingly.

Such a sensor may be seen as a fully distributed or intrinsic sensor, as it uses the intrinsic scattering processed inherent in an optical fibre and thus distributes the sensing function throughout the whole of the optical fibre.

Figure 2:
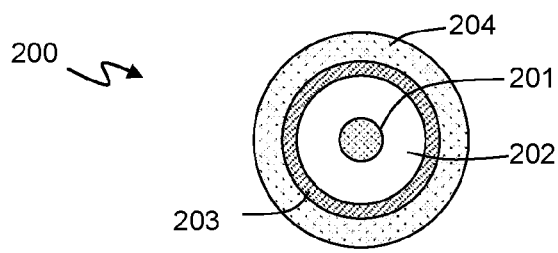
FIG. 2 illustrates a conventional fibre optic cable.

FIG. 2 illustrates generally one example of a known type of fibre optic cable 200 that could be used to provide the sensing fibre. FIG. 2 illustrates a cross section through the fibre optic cable. The fibre optic cable 200 comprises at least one optical fibre 201, which will typically comprise a core and cladding (not illustrated) and possibly a fibre jacket as will be well understood by one skilled in the art. In some applications there may be more than one optical fibre 201. The optical fibre(s) 201 may be located within a buffer material 202 for protection of the optical fibre. In some fibre optic cables the buffer may be a material that is tightly bound to the optical fibre(s) of the cable but other designs are known including gel filled cables where the gel provides the buffer material. In this example the buffer material 203 is surrounded by an armour layer 203. The armour layer 203 may be provided to provide strengthening and protection of the optical fibre(s) 201. In some applications the armour layer may be a metallic layer and may for instance comprise a tube of steel or similar material. In some applications however the cable is desired to have some flexibility and a steel tube would be too inflexible. In such instances the cable may comprise a flexible armour layer such as an aramid layer or braided metallic shield. The aramid or braided metallic layer will be tightly wound so as to form an effectively continuously armour layer to protect the fibre on all sides and bound to the buffer layer to protect the fibre layer from being overextended if subject to a longitudinal force, e.g. pulling on the cable. An outer jacket material 204 may be provided to give environmental protection, e.g. to make the cable watertight and/or gas impermeable.

One skilled in the art will of course appreciate that there are a variety of fibre optic cable designs and in other designs there may be additional armour layers or there may be no armour at all. In some designs there may be a central strength member such as a metallic rod or wire running along the path of the cable axis. There additionally may be more buffer and/or jacket layers.

A fibre optic cable 200 such as described with respect to FIG. 2 may be usefully employed in many applications for DAS. However, as mentioned above, if the optical fibre 201 of such a fibre optic cable 200 is used for DAS sensing, such a sensing fibre will be preferentially sensitive to pressure waves propagating along the longitudinal axis of the cable. A longitudinal pressure wave will cause a compression of the medium in which the fibre optic cable is deployed. At least some of the force due to the pressure wave, i.e. the dynamic strain, will be transmitted to the optical fibre 201 via the intermediate layers (the amount of coupling being dependent on the properties of the intermediate layers). However a pressure wave propagating transversely with respect to the cable axis (i.e. the longitudinal cable axis) may largely cause the fibre optic cable to move from side to side, especially if any armour or strength layer 203 comprises a relatively flexible material such as aramid.

Embodiments of the present disclosure therefore relate to a fibre optic cable structure suitable for fibre optic sensing, for example for DAS, which has an improved sensitivity, especially to transverse pressure waves. The fibre optic cable structure comprises a bend inducer, which is configured to control bending of the optical fibre within the cable structure in response to a change in an environmental parameter, i.e. a defined physical parameter affecting the cable. In some embodiments, e.g. for DAS, this physical parameter may be pressure or force acting on the cable structure in a direction transverse to the central longitudinal axis of the fibre optic cable structure. In other instances however the environmental physical parameter may be temperature or magnetic field.

The bend inducer is a structure or physical arrangement formed as part of the fibre optic cable structure that responds to changes in the environmental physical parameter, e.g. pressure, to impart a change in curvature to the sensing optical fibre. The bend inducer is thus configured such that a first value of the environmental parameter, e.g. a first static value of pressure, will cause the bend inducer to adopt a first configuration. The bend inducer and optical fibre are arranged within the fibre optic cable structure such that the bend inducer adopting the first configuration induces a first curvature in the optical fibre. A second, different, value of the environmental parameter, e.g. a second, different static value of pressure, causes the bend inducer to adopt a second configuration, that induces a second, different, curvature in the optical fibre. Thus a change in the value of the environmental parameter, e.g. a change in the value of pressure acting on the cable structure, will result in a change of the configuration, i.e. shape or formation, of the bend inducer, which will in turn induce a resultant change in curvature of the optical fibre. The bend inducer thus converts changes in the environmental parameter into a bending force or bending moment, resulting in a change of the degree of bending of the optical fibre. The bend inducer can thus be seen as a force transformer.

Optical fibres utilised for fibre sensing, such as DAS, have been shown to be highly sensitive to bending. Bending of an optical fibre can induce both longitudinal and radial strain, which, if the optical fibre is moved away from the neutral axis, is equivalent to an effective length change of that part of the fibre. For a distributed fibre optic sensor, both of these strain components within a sensing portion of the optical fibre will lead to a detectable change in properties of the backscatter radiation from that sensing portion. An optical path length change, in effect, results in a change in bias point of a virtual interferometer formed from the various scattering sites within the optical fibre, as would be understood by one skilled in the art. For a fibre Bragg grating based sensor the change in length varies the properties of the grating, as would also be understood by one skilled in the art.

Thus a fibre optic cable structure according to an embodiment of the present disclosure provides for a highly sensitive signal detector in a fibre optic sensor system.

It has also been observed that bending an optical fibre can induce birefringence effects in at least some types of optical fibre. In some sensor systems polarisation of the backscatter optical radiation may be of interest and a cable structure according to embodiments of the present invention may allow polarisation effects to be exploited to provide enhanced or additional sensing.

The bend inducer may be implemented in a number of different ways, as will be discussed below. In some embodiments the bend inducer comprises first and second components. The first component of the bend inducer has a longitudinal dimension or length that varies with the environmental parameter, i.e. such that a change in environmental parameter will tend to result in a change in the dimension of at least part of the first component, at least for a certain operating range of values of the environmental parameter.

The second component of the bend inducer has a longitudinal dimension or length that also varies with the environmental parameter, but the second component exhibits a variation in length for a given variation in the environmental parameter that is different to the first component.

Figure 3A:
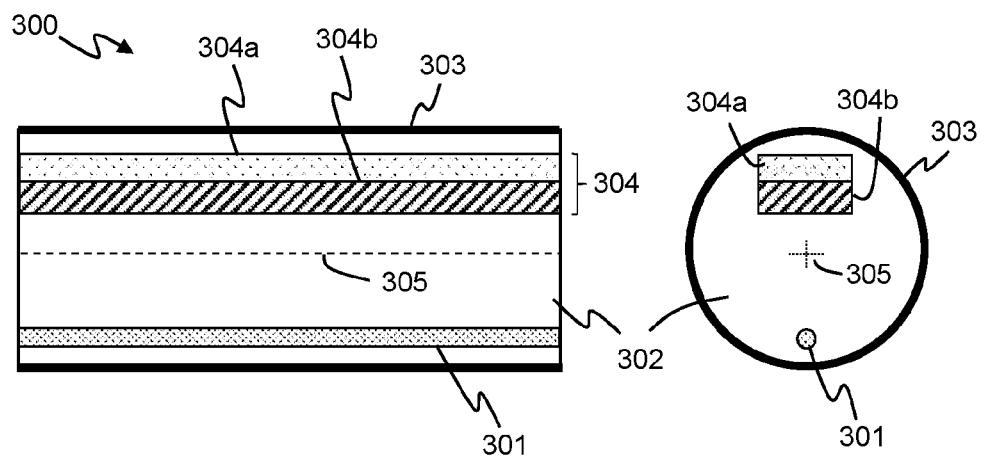
FIGS. 3a, 3b and 3c illustrate a fibre optic cable structure having a bend inducer according to an embodiment.

FIG. 3a illustrates side and end sections of a fibre optic cable structure 300 according to one embodiment. Fibre optic cable structure 300 comprises an optical fibre 301, compliant material 302 and a jacket material 303. The fibre optic cable structure 300 also includes a bend inducer 304. In this example the bend inducer 304 comprises a first component 304a and a second component 304b. The first component 304a and the second component 304b each run along at least part of the longitudinal length of the cable structure 300. The first component 304a is configured to have a dimension that varies in response to the environmental parameter of interest, for instance applied strain or pressure. The second component 304b is also configured to have a longitudinal dimension that varies in response to the environmental parameter of interest, but the second component 304b exhibits a variation in said dimension for a given variation in the environmental parameter that is different to the first component 304a. In other words, for a given change in the environmental parameter of interest acting on part of the cable structure 300, the corresponding part of the first component 304a will exhibit a variation in longitudinal length that is more positive/less negative than the variation in longitudinal length of the corresponding part of the second component 304b. The first and second components 304a and 304b are mechanically coupled to the fibre structure such that this difference in change in longitudinal length of the two components results in a change of curvature of the bend inducer 304. The bend inducer 304 is mechanically coupled to the optical fibre 301, in this instance via compliant material 302, such that the change in curvature of the bend inducer 304 also results in a change in curvature of the optical fibre 301.

In some embodiments the first component 304a may be configured to exhibit a change in longitudinal length in response to a given change in environmental parameter that is of the opposite polarity to that of second component 304b. In other words a given change in the environmental parameter may result in an elongation (positive change) of the first component 304a but a contraction (negative change) of the second component 304b or vice versa.

In some embodiments the first component 304a may be a material or structure which exhibits a first Poisson ratio and the second component 304b may be a material or structure which exhibits a second, different, Poisson ratio. In some instances the first and second Poisson ratios may be of the opposite polarity to one another. One skilled in the art would be aware of a range of materials that exhibit different Poisson ratios. Such a bend inducer 304 would respond to applied pressure and adopt a particular curvature and variation in applied pressure would result in a change in curvature.

Figure 3B:
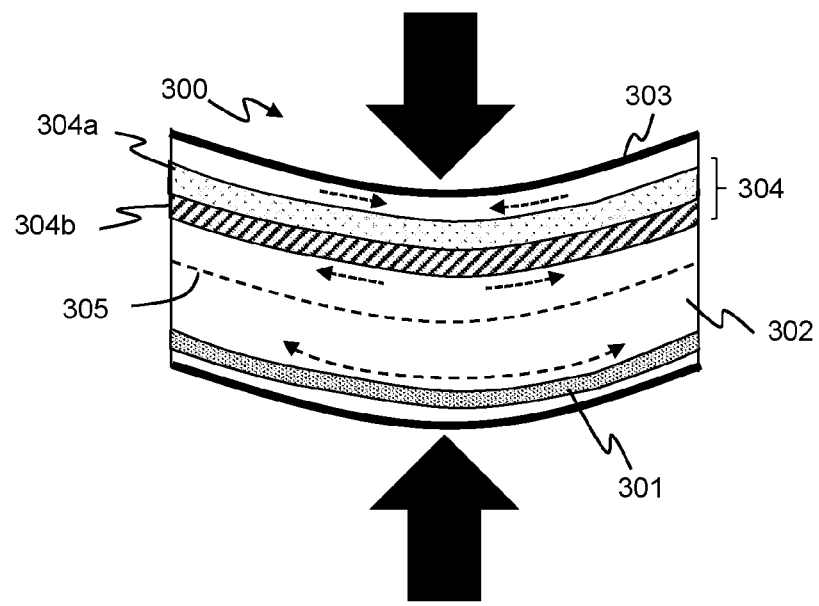
Figure 3C:
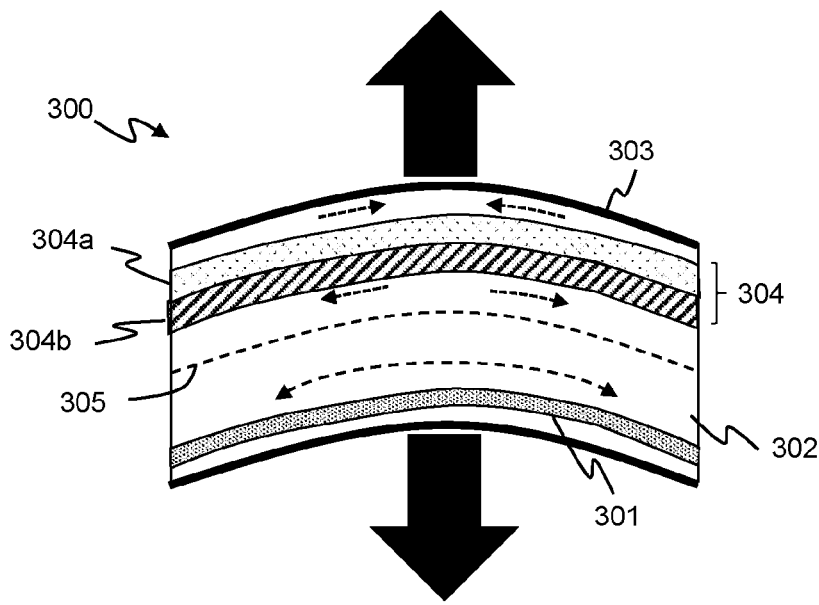

FIGS. 3b and 3c illustrate how the bending arrangement 304 induces a bend in optical fibre 301 in response to variation in applied pressure. In FIG. 3b a positive pressure change, i.e. an increased pressure that results in a compression force, is applied to the fibre optic cable structure 300 as illustrated by the large arrows. As illustrated, the compression force acts on two opposite sides of the fibre optic cable structure 300 and is transmitted, via the compliant material 302, as a compressive force acting on the bend inducer 304. In this example the first component 304a exhibits a negative change in longitudinal length to increased pressure, for instance the first component may comprise a material with a negative Poisson ratio. Thus in response to compression acting on the first component 304a, this first component 304a will contract in the longitudinal direction of the material and induce an axial strain. Conversely, the second component 304b exhibits a positive change in longitudinal length to increased pressure, for instance the second component may be a material with a positive Poisson ratio. Thus, in response to the compression acting on the second component 304b, the component will expand in the longitudinal direction, which also produces an axial strain. Due to the cooperative effect of the contraction of the first component 304a and the expansion of the second component 304b, the bend inducer 304 adopts a bent configuration and a bending force or moment is applied to the fibre optic cable structure 300 and, via the compliant material, to the optical fibre 301 within it. Thus, from the configuration of the first and second components 304a and 304b of the bend inducer arrangement 304, a bending force can be applied to an optical fibre 301 in response to a transverse compression force, thus increasing the sensitivity of the optical fibre 301 to transverse pressure when used for fibre optic sensing.

FIG. 3c also illustrates the operation of fibre optic cable structure 300 in response to a negative pressure change, i.e. a decreased pressure that provides an outward radial tension force. The first component 304a and second component 304b will again react differently to one another in response to such a force or change in applied pressure. In this instance the first component 304a experience an expansion in the longitudinal direction, whilst the second component 304b will contract in the longitudinal direction. This results in a bending force or moment again being applied to the fibre optic cable structure 300, but in the opposite direction as compared to FIG. 3b. The bend induced in optical fibre 301 will again produce a highly detectable response if the fibre optic cable structure 300 was used for fibre optic sensing, such as DAS.

Thus the fibre optic cable structure 300 can provide an improved sensitivity to transverse pressure waves/displacement when used for fibre optic sensing. Fibre optic cable 300 is thus advantageous compared to conventional fibre optic cables for detecting acoustic signals of interest that are incident transversely, i.e. transversely propagating pressure waves or other transverse forces.

FIGS. 3a to 3b illustrate first component 304a and second component 304b being adjacent to one another. The first and second components could for instance be bonded or otherwise fixed to one another. However this is not necessary and in other arrangements the first and second components could be located apart from one another, provided that they are mechanically coupled via the fibre optic cable structure so as to cooperate to provide the bending forces.

In some embodiments, as illustrated in FIG. 3a, the optical fibre 301 may be located toward one side of the fibre optic structure, i.e. away from a central longitudinal axis of the fibre optic cable structure, so as to maximise the amount of path length change due to the induced bending. In some embodiments the bend inducer 304 may be arranged so as to induce bending on the other side of the cable, i.e. on the opposite side of the central longitudinal axis to the optical fibre 301 so as to improve the bending moment experienced by the optical fibre in use.

Whilst the operation of fibre optic cable structure 300 has been explained as being able to induce a bend in response to a transverse pressure, the principle of operation could be equally applied to detect other environmental parameters. In an embodiment, first component 304a and second component 304b may comprises first and second materials respectively having different coefficients of thermal expansion. In such a cable the temperature would lead the bend inducer 304 to adopt a particular configuration which would change with temperature.

In another embodiment, the environmental parameter could be magnetic field and the first component 304a and second component 304b may comprise magnetostrictive materials where the materials are arranged to provide a different magnetostrictive response from one another, i.e. to have different magnetostrictive coefficients. Thus, this embodiment provides for a fibre optic cable structure with improved sensitivity to variations in magnetic field.

Thus embodiments of the present disclosure provide for a fibre optic cable structure that induces bending in an optical fibre in response to a change in a particular environmental parameter, the bending arising from a change in configuration or a deformation of a bend inducer arranged as part of a fibre optic cable structure Utilizing a fibre optic cable structure according to embodiments in a fibre optic sensor, such as a DAS system, provides for a sensing apparatus with improved sensitivity to changes in the relevant environmental parameter. Embodiments have been described in relation to of the environmental parameter being pressure, temperature or magnetic field. However, it will be appreciated that a fibre optic cable structure according to the present disclosure could be configured to respond to any physical environmental parameter that can act on a bend inducer to cause to differential change in longitudinal length of different parts of the bend inducer.

It will be appreciated the bend inducer 304 adopts a particular configuration, with a defined degree of curvature, depending on the static value of the relevant environmental parameter. Thus the bend inducer will adopt a first configuration with a first degree of curvature at a first static value of that parameter. The first configuration may be a straight or generally linear configuration, e.g. as illustrated in FIG. 3a, over at least part of the length of the fibre optic cable structure. If the environmental parameter changes to a second value, the bend inducer will adopt a second configuration with a second, different, degree of curvature and will maintain that configuration if the value of the environmental parameter remains static. The bend inducer 304 therefore induces a particular configuration, which may include some bend, in the fibre optic cable structure 300 in response to particular static value of a parameter. The bend inducer 304 would therefore induce a bend in response to a uniform static field for at least one value of the environmental parameter. The bend inducer thus defines the amount of bend of the cable structure in response to the present value of the environmental parameter and can generate a bending force from a change of parameter that applies evenly along the length of the cable structure. The bend inducer does not therefore simply respond to, or amplify, a bend due to a differential force being applied to the cable structure.

In the illustrated embodiments in FIGS. 3a to 3c, the first component 304a and second component 304b are deployed within the fibre optic cable structure 300 to work together to induce bending of the optical fibre 301. As mentioned the first and second components may comprise different materials, e.g. strips or rods of material embedded within the fibre optic cable structure. In an embodiment, first component material 304a and second component material 304b may be coupled together directly such that they form a composite material that can induce a bend in the structure 300. The skilled person will understand there are many suitable coupling and bonding methods to form composite materials.

In one embodiment the first and second components 304a and 304b may comprise different metallic materials. Coupling the materials of first and second components 304a, 304b may provide manufacturing advantages as both the composite bend inducer 304 may then be deployed within the fibre optic cable structure 300 as a single item, at least for a length of the cable structure.

The exact configuration and composition of fibre optic cable structure 300 may be tailored for a given application. The stiffness of the fibre optic cable materials such as the jacket layer, compliant material, bend inducer and optical fibre may be balanced to provide an appropriate amount of bend for the optical fibre for a given application. In one embodiment, the stiffness of the bend inducer will be equal to the stiffness of the fibre optic cable structure and/or the optical fibre. The optimum physical properties of the bend inducer can be established for a given application. A desired sensitivity for the cable structure could also be achieved by selecting an appropriate location for the optical fibre within the cable structure. The optical fibre could be positioned closer or further away from the central longitudinal axis of the cable structure in order to provide a desired degree of bend the optical fibre for a given stimulus for a given application.

The bend inducer 304 illustrated in FIG. 3a induces bending in only a single plane, i.e. the plane of the page as illustrated in FIGS. 3b and 3c. The bend inducer 304 is able to adopt a generally straight or linear configuration as shown in FIG. 3a and is also able, depending on the value of the environmental parameter to bend in either direction within the plane, i.e. to adopt a concave or convex curvature as viewed from one side of the bend inducer. This arrangement can provide a good range of sensitivity to the expected range of the environmental parameter. Bending in one plane may be sufficient for many applications. For instance a pressure wave acting on the cable structure may result in the pressure variation being experienced all around the cable structure. A transverse strain acting on the cable structure in a direction orthogonal to the plane in which bending occurs may compress or elongate the compliant material in that direction, with a consequent force being applied by the compliant material to the bend inducer in the plane of bending.

In some embodiments however, one or more bend inducers could be configured so as to induce the optical fibre 301 to bend in multiple planes. In one embodiment a plurality of different materials forming an overall bend inducer arrangement could be deployed within fibre optic cable structure 300 along different longitudinal axis of the fibre optic cable structure 300. This configuration could then induce bends along different axes. The various materials would, of course, need to be deployed so the response of the different materials to the environmental parameter did not cancel. In another embodiment, the bending inducer 304 could be arranged along a helical path within the fibre optic cable structure, or there could be different bend inducers at different parts of the cable in a different orientation, such that at different point along optical fibre structure 300, the bend inducer would induce the optical fibre to bend in different planes.

This bend inducer 304 could be configured so as to provide the generally straight configuration when there is no significant external force to the fibre optic cable structure (or for the temperature or magnetic field variants at the normal expected operating temperature or magnetic field). This may make it easier for deployment and handling of the cable structure. Of course it will be appreciated that the cable structure itself will still have a degree of flexibility and may be deployed along a non rectilinear path in use, especially over long lengths of the fibre optical cable. However usually the cable will not be deployed to lie in a path with many tight bends and thus over a given length of the cable structure, say a length of a few tens of centimetres or a few metres say, the path of the fibre optic cable may be substantially straight or only gently curved. In some embodiments however the bend inducer could be arranged to provide a defined non-zero curvature in the absence of an external stimulus and then increase and/or decrease curvature in response to an applied force, e.g. increasing or decreasing pressure (or change in temperature or magnetic field away from a nominal operating point).

In some embodiments the fibre optic structure 300 may have one or more bend inducer 304 deployed along substantially the entire length of a fibre optic cable such that substantially all of the fibre optic would exhibit an improved sensitivity. In another embodiment, one or more portions of the fibre optic cable may comprise a bend inducer 304, whilst other portions may not comprise any bending arrangements, i.e. may be free of a bend inducer.

Whilst the bend inducer 304 may be implemented by using different materials that cooperate together to induce a bend in an optical fibre 301 as the first and second components, other arrangements are possible. In particular the bend inducer may comprise a mechanical arrangement of moving part designed to provide the bending.

Figure 4A:
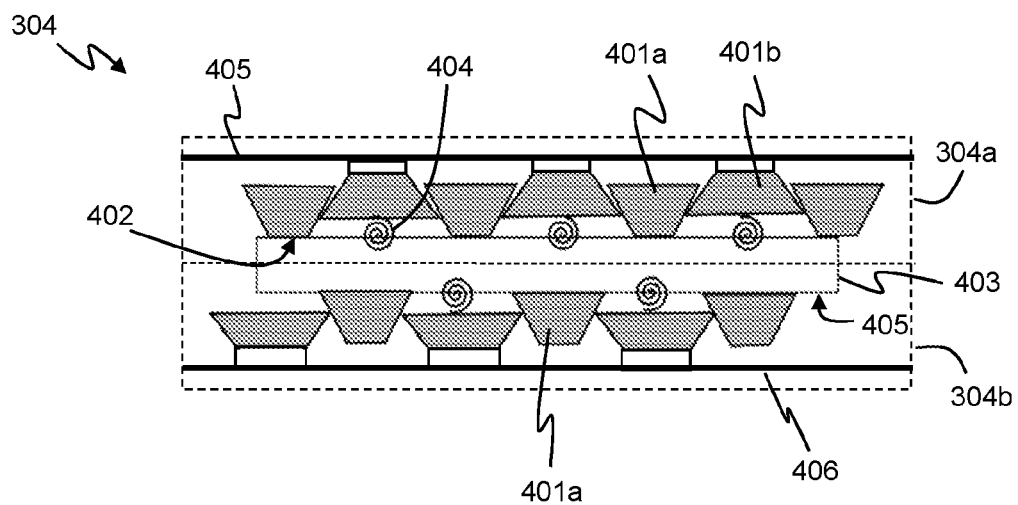
FIGS. 4a and 4b illustrate a bend inducer according to an embodiment.

FIG. 4a illustrates a side view of a bend inducer 304 according to an embodiment in which similar components as described previously are identified using similar reference numerals. In this embodiment the bend inducer 305 again comprises a first component 305a and a second component 305b that cooperate to induce bending of the optical fibre 301.

Each of the first and second components 304a and 304b comprise a plurality of elements 401a, 401b deployed adjacent to one another longitudinally along the length of the fibre optic cable structure, where at least some of the elements are movable with respect to one another in a generally transverse direction. The elements 401a, 401b are shaped such that the relative transverse movement of an element with respect to its neighbouring elements changes the configuration of the elements, and results in a change in the distance between the elements.

In the example of FIG. 4a, the first component 304a comprises a plurality of first elements 401a and a plurality of second elements 401b, each first element 401a being disposed adjacent a respective second element 401b. The first elements 401a are fixedly attached to a flexible first inner surface 402 on one side of the first component 304a, e.g. a surface of a flexible member 403. The second elements 401b are disposed so as to be moveable with respect to first surface 402 in a transverse direction. The second elements 401b may be coupled to the flexible surface 402 via a resilient connection 404 and/or the second elements 401b may be fixedly coupled to a flexible first outer surface 405 on the opposite side of the first component 304a to the first internal surface 402. In use a positive pressure change, or increase in inward transverse force, may thus force the second elements 401b closer to the first internal surface 402 and a negative pressure change, or force in the opposite direction, may draw the second elements 401b further from the first internal surface 402.

As noted above the first elements 401a are fixedly coupled to the first internal surface 402 on one side via a fixed end, however the other ends of the first elements are relatively free to move with respect to one another. The first and second elements have a shape profile such that movement of the second elements 401b in the longitudinal direction varies the separation of the free ends of the first elements 401a. In the example of FIG. 4a the first elements 401a have a shape which widens from a first longitudinal dimension at the fixed end at the first internal surface to a second larger dimension at the free end. The second elements have a shape profile that does the opposite and is widest at the end nearest the first internal surface 402.

The second component 304b of the bend inducer 304 also comprises first elements 401a that are fixedly coupled to a second internal surface 405, which could be an opposite surface of flexible member 403. The second component 304b also comprises interposed second elements 401a that are resiliently coupled to the second inner surface and/or couples to a second output surface 406 so as to allow transverse movement. Again the first and second elements 401a and 401b have a shape profile the determines the separation between the free ends of the first elements, but the shape profile of the first and second elements 401a and 401b of the second component is opposite to that of the first component 304a.

Figure 4B:
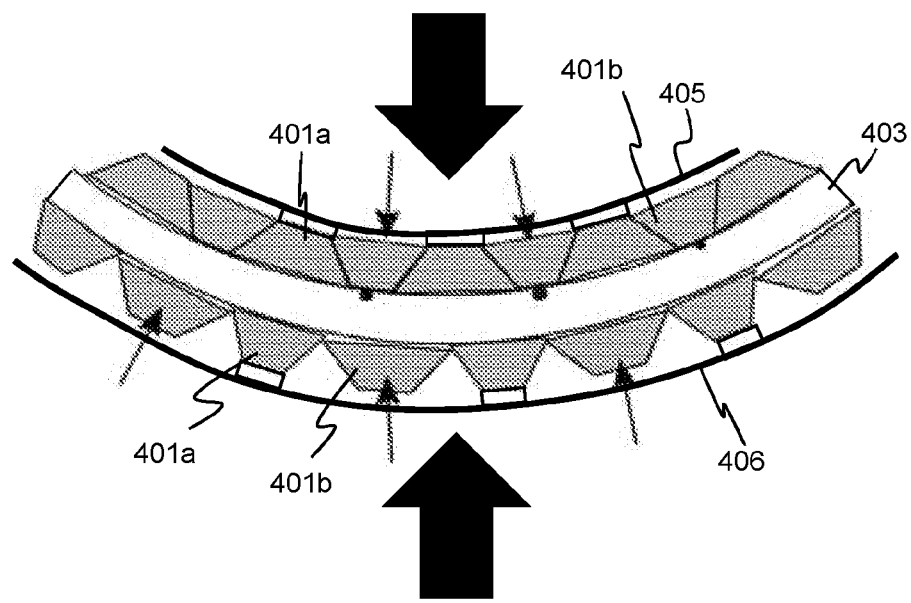

Due to the configuration of the first and second elements of each of the first and second components 304a and 304b of the bend inducer, a change in pressure acting on the bend inducer will cause a change in curvature of the bend inducer. In response to a positive pressure variation, i.e. an increase in pressure, the second elements 401b of the first component 304a move closer to the first inner surface 402. This means the widest part of the second elements 401a is located nearer the fixed ends of the first elements 401a, where the first elements are narrower, with the result that the separation between the free ends of the first elements 401a can reduce. Conversely for the second component 304b the movement of the second elements 401b toward the second inner surface 405 causes the widest part of the second elements 401b to move closer the wider fixed ends of the first elements, which results in the free ends of the first elements 401a of the second component being forced further apart. Collectively this causes the bend inducer to adopt a curved configuration as illustrated in FIG. 4b.

Once the increased pressure stops acting on the bend inducer 305, the resilient couplings 404 may urge the second elements 401b, of both the first and second components 304a and 304b, back to a quiescent equilibrium position, e.g. such as illustrated in FIG. 4a. A negative pressure change, i.e. decrease in pressure would have the opposite effect and could lead to bending in the opposite direction.

The first and second elements 401a and 401b have been illustrated and described as comprising a trapezoidal structure. However, it will be appreciated that other shapes could be implemented to achieve the same effect without departing from the scope of the present disclosure.

It will be appreciated that at least some of the internal or external surfaces of the bend inducer described with respect to FIG. 4a could be surfaces of other components of the fibre optic cable structure. For instance at least one of the outer surfaces 405 and/or 406 could be a jacket layer 303 of the fibre optic cable structure. In some embodiments the bend inducer may be coupled to the fibre optic cable. In some embodiments the optical fibre could be deployed to run through the flexible member 403, although it may be preferred to implement the bend inducer in a figure optic cable structure in a similar manner as illustrated in FIG. 3a. In particular the bend inducer 304 could be offset from the optical fibre 301 on the other side of the central or neutral axis of the cable structure 300 to maximise the bending forces on the optical fibre 301.

The bend inducer described with reference to FIGS. 3 and 4 operates so that, in response to a change in the environmental parameter, a first component responds with a change in longitudinal length on at least one side of the component, and a second component responds with a different change in longitudinal length, on at least one side of the component. A similar bending effect can be induced by a bend inducer configured such that a first side of the bend inducer responds to a change in environmental parameter with a change in longitudinal length which is different to that of another side of the bend inducer.

Figure 5A:
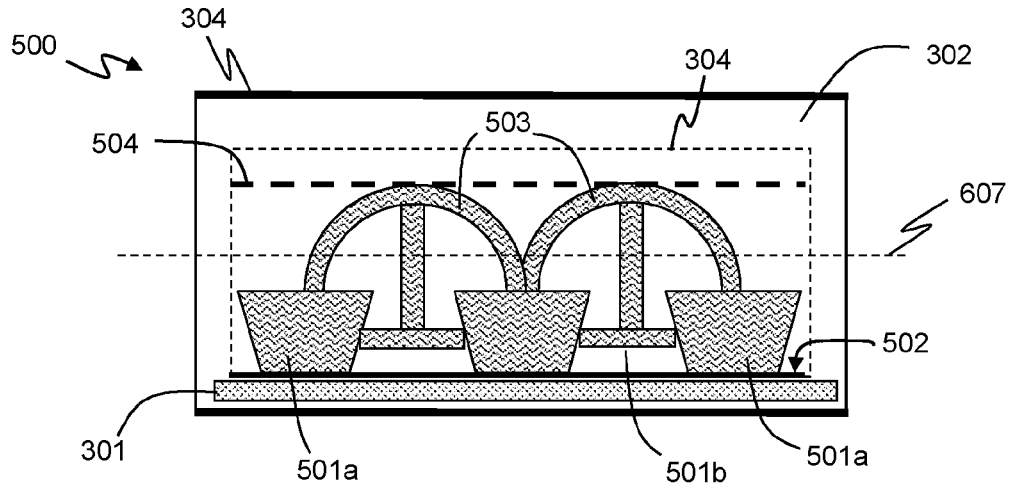
FIGS. 5a, 5b and 5c illustrate another example of fibre optic cable structure having a bend inducer according to an additional embodiment.

FIG. 5a illustrates a side cross-section through part of a fibre optic cable structure 500 according to a further embodiment in which similar features are identified by the same reference numerals. Fibre optic cable structure 600 comprises optical fibre 301, compliant material 302, jacket layer 303 and bend inducer 304.

In this embodiment the bend inducer 305 comprises a plurality of first elements 501a fixedly coupled to a first surface 502 and a plurality of second elements 501b that are moveable with respect to the first surface 502 in a transverse direction. In a similar manner as discussed above the second elements are interposed between the first elements (or vice versa) and configured such that movement of second element 501b in the transverse direction determines, at least partly, the degree of separation of the first elements 501a. In this example the first elements 501a have a dimension in the longitudinal direction that varies with transverse distance from the first surface 502 and, in this example is a trapezoidal profile that widens from the smallest dimension at the fixed end at the first surface to a greater dimension at the end opposite the first surface 502. In this example the second element is a plunger element which may, for example have a T-shaped profile, although it will be appreciated that other shapes for the first and/or second elements 501a and 501b could be implemented.

The second elements are supported by arms 503 that connect the ends of the first elements 501a opposite the first surface 502. The arms may be formed of a generally resilient material, e.g. are elastically deformable. The arms 505 can be seen as defining a second side 504 of the bend inducer 304. In some embodiments the arms could be coupled to a flexible surface.

Figure 5B:
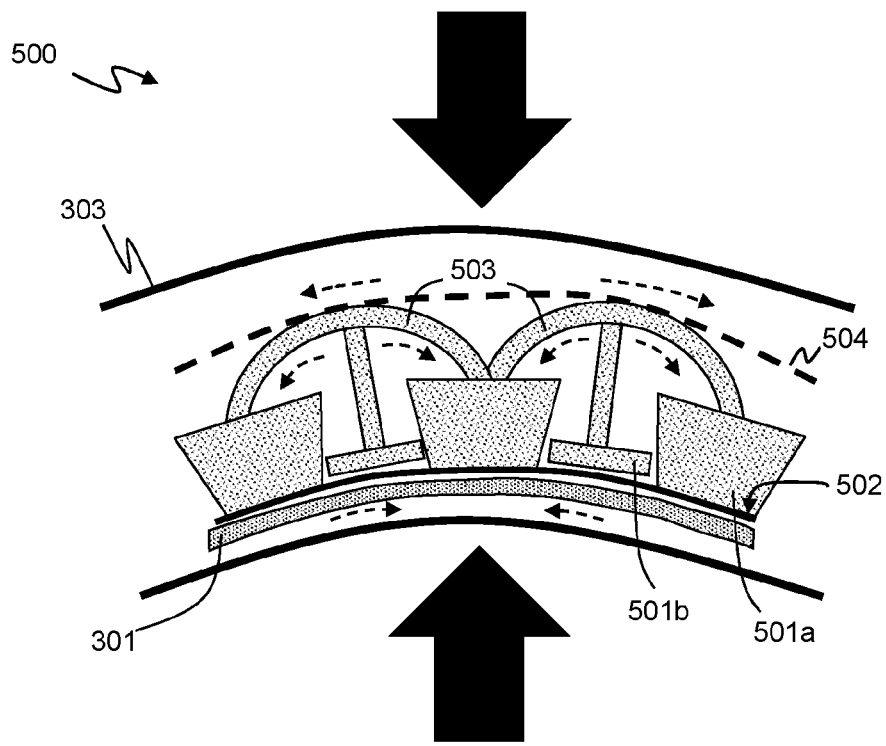

In use, a positive pressure change acting on bend inducer 503 will, as illustrated in FIG. 5b, tend to cause the arms 503 to flatten, which will have the effect of tending to increase the separation between the same point on adjacent arms and elongate the second side 504 of the bend inducer. This will also tend to force apart the ends of the first elements 501a connected to the arms 503. Given that the second element will also be pushed towards the first surface 502, where the first elements are narrower, this is accommodated by the ends of a first elements at the first surface 502 approaching closer to one another. Thus the first side of the bend inducer 304 will effectively contract and the bend inducer 304 adopts a particular curved configuration.

Figure 5C:
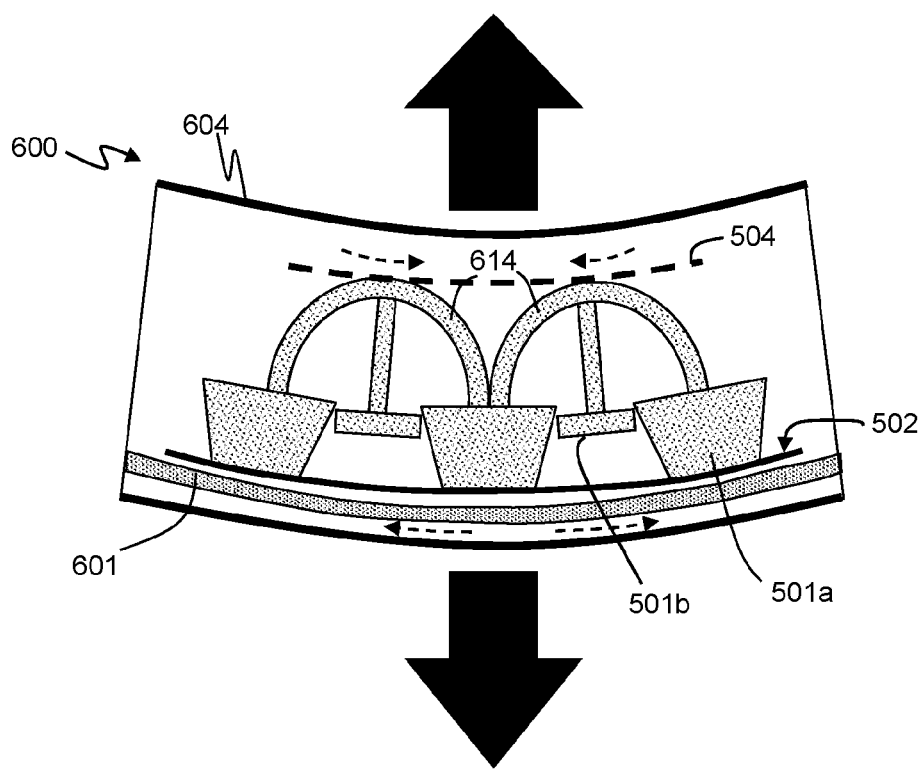

A negative pressure change acting on bend inducer 503 will, as illustrated in FIG. 5c, tend to cause the arms 503 to become more arched, and will pull the second element 501b further from the first surface 502 to where the first elements 501a are wider. This will tend to separate the first element 501a from one another and will be accommodated by adjacent arms getting closer to one another. Thus the first surface 502 will tend to elongate and the second side 504 will effectively contract.

In effect one side of the bend induced exhibits behaviour akin to having a positive Poisson ratio and the other side exhibits behaviour akin to having a negative Poisson ratio.

In some embodiments the optical fibre 301 could be coupled to one side of the bend inducer, indeed the first surface 502 could, in some embodiments be a surface of the optical fibre. Additionally or alternatively one side of the bend induced could be provided by a jacket material of the cable structure. In some embodiments however the bend inducer could be located in part of the cable structure with the optical fibre 301 being relatively remote therefore and positioned to enhance the bending moment on the optical fibre due to any bend induced by the bend inducer.

In general therefore embodiments of the present disclosure relate to a fibre optic cable structure having a bend inducer responsive to an environmental parameter to control bending of the optical fibre. The bend inducer is configured to adopt different configurations, which induce different degrees of curvature, at different values of the environmental parameter. The bend inducer may be configured such that a first component or first side of the bend inducer experiences a change in longitudinal length in response to a change in the value of the environmental parameter and a second component or second side of the bend inducer experiences a change in longitudinal length in response to a change in the value of the environmental parameter that is different to that of the first component of first side.

The environmental parameter may be pressure or applied force leading to displacement. In such a case the fibre optic cable structure may provide enhanced sensitivity for transverse pressure when used for fibre optic sensing, in particular distributed fibre optic sensing such as DAS although the same principles apply to grating based sensing. In some embodiments the environmental parameter may be temperature or magnetic field.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

The invention claimed is:

1. A fibre optic cable structure comprising:
an optical fibre; and
a bend inducer that is responsive to an environmental parameter to control bending of the optical fibre, wherein the bend inducer comprises:
a first component with a longitudinal dimension that varies with the environmental parameter; and
a second component with a longitudinal dimension that varies with the environmental parameter; wherein the amount of variation in the longitudinal dimension of the first component to a given change in the environmental parameter differs from the amount of variation in the longitudinal dimension of the second component to the given change in the environmental parameter, and wherein the first component and second component are configured such that a given change in the environmental parameter results in a positive change in the longitudinal dimension for one of the first or second components and a negative change in the longitudinal dimension for the other of the first or second components;

wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre.

2. The fibre optic cable structure of claim 1, wherein the first component of the bend inducer is adjacent to the second component of the bend inducer.

3. The fibre optic cable structure of claim 1, wherein the first component comprises a first material that has a first relationship between the environmental parameter and changes in the longitudinal dimension and the second component comprises a second material that has a second, different, relationship between the environmental parameter and changes in the longitudinal dimension.

4. The fibre optic cable structure of claim 3, wherein the environmental parameter is one of: pressure; temperature or magnetic field strength; and wherein the first and second materials are materials that differ with respect to: Poisson ratio; thermal coefficient of expansion; or magnetostrictive coefficient respectively.

5. The fibre optic cable structure of claim 1, wherein the bend inducer is located on one side of a central longitudinal axis of the fibre optic cable structure and the optical fibre is located on an opposite side of the central longitudinal axis.

6. The fibre optic cable structure of claim 1, wherein the bend inducer is configured to have a stiffness that substantially matches at least one of: a stiffness of the fibre optic cable structure; or a stiffness of the optical fibre.

7. The fibre optic cable structure of claim 1, configured for distributed fibre optic sensing.

8. A fibre optic cable structure comprising:
an optical fibre; and
a bend inducer that is responsive to an environmental parameter to control bending of the optical fibre, wherein the bend inducer comprises:
a first component with a longitudinal dimension that varies with the environmental parameter; and
a second component with a longitudinal dimension that varies with the environmental parameter; wherein the amount of variation in the longitudinal dimension of the first component to a given change in the environmental parameter differs from the amount of variation in the longitudinal dimension of the second component to the given change in the environmental parameter;
wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre,
wherein at least one of the first or second components of the bend inducer comprises a plurality of elements adjacent to one another along a longitudinal direction, with at least some of the plurality of elements being moveable with respect to one another in a transverse direction, and wherein the elements are shaped such that relative transverse movement of an element with respect to its neighbouring elements changes the configuration of the elements and results in a change in a distance between the elements.

9. The fibre optic cable structure of claim 8, wherein the plurality of elements comprises a plurality of first elements fixedly coupled to a first surface and a plurality of second elements, each second element being adjacent to at least one first element, the second elements being moveable transversely with respect to the first surface.

10. The fibre optic cable structure of claim 9, wherein each element of the plurality of second elements is coupled to at least one of: the first surface via resilient couplings; or a second surface on the opposite side of the second elements to the first surface.

11. A fibre optic cable structure comprising:
an optical fibre; and
a bend inducer that is responsive to an environmental parameter to control bending of the optical fibre;
wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre,
wherein the bend inducer is configured such that a given change in the environmental parameter results in a positive change in a longitudinal dimension on a first side of the bend inducer components and a negative change in longitudinal dimension on a second, opposite side of the bend inducer, wherein the bend inducer comprises:
a plurality of first elements fixedly coupled to a first surface at a first end and coupled to one another by resilient arms at a second opposite end; and
a plurality of second elements, each second element being located between two first elements and supported by the resilient arms, such that transverse force applied to the resilient arms causes the second element to move transversely with respect to the first surface;
wherein the first and second elements are shaped such that relative transverse movement of a second element with respect to its neighbouring first elements results in a change in the distance between the first elements.

12. A fibre optic cable structure comprising:
an optical fibre; and
a bend inducer that is responsive to an environmental parameter to control bending of the optical fibre;
wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre, and wherein the bend induced is arranged along a helical path within the fibre optic cable structure.

13. A fibre optic cable structure comprising:
an optical fibre; and
a bend inducer that is responsive to an environmental parameter to control bending of the optical fibre;
wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre, and wherein the fiber optic cable structure further comprises a plurality of bend inducers, wherein at least some the bend inducers are configured to induce curvature of the optical fibre in different planes to one another.

14. A fibre optic sensing system comprising:

a fibre optic cable structure comprising: (i) an optical fibre; and (ii) a bend inducer that is responsive to an environmental parameter to control bending of the optical fibre; wherein the bend inducer comprises: (a) a first component with a longitudinal dimension that varies with the environmental parameter; and (b) a second component with a longitudinal dimension that varies with the environmental parameter; wherein the amount of variation in the longitudinal dimension of the first component to a given change in the environmental parameter differs from the amount of variation in the longitudinal dimension of the second component to the given change in the environmental parameter, wherein the first component and second component are configured such that a given change in the environmental parameter results in a positive change in the longitudinal dimension for one of the first or second components and a negative change in the longitudinal dimension for the other of the first or second components, and wherein the bend inducer is configured to adopt a first configuration at a first value of the environmental parameter that induces a first curvature of the optical fibre and to adopt a second configuration at a second, different, value of the environmental parameter that induces a second, different, curvature of the optical fibre such that a change in value of the environmental parameter imparts a bending force on the optical fibre; and an interrogator unit for interrogating the optical fibre with electromagnetic radiation to provide fibre optic sensing.

15. The fibre optic sensing system of claim 14, wherein the interrogator unit is configured for distributed acoustic sensing and wherein the environmental parameter is pressure.

\* \* \* \* \*